United States Patent
Asada et al.

(10) Patent No.: US 10,505,074 B2
(45) Date of Patent: Dec. 10, 2019

(54) NITRIDE SEMICONDUCTOR LIGHT EMITTING ELEMENT INCLUDING ELECTRON BLOCKING STRUCTURE LAYER

(71) Applicant: NICHIA CORPORATION, Anan-shi, Tokushima (JP)

(72) Inventors: Koji Asada, Tokushima (JP); Tokutaro Okabe, Tokushima (JP)

(73) Assignee: NICHIA CORPORATION, Anan-Shi (JP)

(*) Notice: Subject to any disclaimer, the term of this patent is extended or adjusted under 35 U.S.C. 154(b) by 0 days.

(21) Appl. No.: 15/763,375

(22) PCT Filed: Sep. 21, 2016

(86) PCT No.: PCT/JP2016/077888
§ 371 (c)(1),
(2) Date: Mar. 26, 2018

(87) PCT Pub. No.: WO2017/057149
PCT Pub. Date: Apr. 6, 2017

(65) Prior Publication Data
US 2018/0287014 A1 Oct. 4, 2018

(30) Foreign Application Priority Data
Sep. 28, 2015 (JP) .................. 2015-190294

(51) Int. Cl.
*H01L 33/32* (2010.01)
*H01L 33/06* (2010.01)
(Continued)

(52) U.S. Cl.
CPC .............. *H01L 33/32* (2013.01); *H01L 33/06* (2013.01); *H01L 33/145* (2013.01); *H01L 33/36* (2013.01); *H01L 33/025* (2013.01)

(58) Field of Classification Search
None
See application file for complete search history.

(56) References Cited

U.S. PATENT DOCUMENTS 6,466,597 B1 * 10/2002 Kume .................. B82Y 20/00
257/103
6,555,403 B1   4/2003 Domen et al.
(Continued)

FOREIGN PATENT DOCUMENTS

JP   H11-340580 A   12/1999
JP   2000-077795 A   3/2000
(Continued)

OTHER PUBLICATIONS

International Search Report for PCT/JP2016/077888 dated Nov. 1, 2016.
(Continued)

*Primary Examiner* — Bilkis Jahan
(74) *Attorney, Agent, or Firm* — Foley & Lardner LLP

(57) ABSTRACT

A nitride semiconductor light emitting element includes: an n-side layer; a p-side layer; an active layer including: a well layer containing Al, Ga, and N, and a barrier layer containing Al, Ga, and N, wherein an Al content of the barrier layer is higher than that of the well layer; and an electron blocking structure layer between the active layer and the p-side layer and including: a first electron blocking layer disposed between the p-side layer and the active layer and having a bandgap larger than that of the barrier layer, a second electron blocking layer disposed between the p-side layer and the first electron blocking layer and having a bandgap larger than that of the barrier layer, but smaller than the bandgap of the first electron blocking layer, and an intermediate layer disposed therebetween and having a bandgap smaller than that of the second electron blocking layer.

24 Claims, 4 Drawing Sheets

(51) Int. Cl.
*H01L 33/14* (2010.01)
*H01L 33/36* (2010.01)
*H01L 33/02* (2010.01)

(56) References Cited

U.S. PATENT DOCUMENTS

| | | |
|---|---|---|
| 8,748,919 B2 | 6/2014 | Chua |
| 9,190,571 B2 | 11/2015 | Choi et al. |
| 10,141,477 B1* | 11/2018 | Bhusal ................ H01L 33/36 |
| 2002/0053676 A1 | 5/2002 | Kozaki |
| 2003/0001168 A1 | 1/2003 | Tsuda et al. |
| 2003/0205736 A1 | 11/2003 | Kozaki |
| 2005/0098789 A1 | 5/2005 | Kozaki |
| 2005/0127391 A1 | 6/2005 | Yanamoto |
| 2006/0131604 A1 | 6/2006 | Kozaki |
| 2007/0290230 A1* | 12/2007 | Kawaguchi ............ B82Y 20/00 |
| | | 257/196 |
| 2008/0029758 A1 | 2/2008 | Kozaki |
| 2008/0203418 A1 | 8/2008 | Yanamoto |
| 2010/0252811 A1 | 10/2010 | Kozaki |
| 2011/0084249 A1 | 4/2011 | Oh et al. |
| 2012/0138891 A1 | 6/2012 | Chung et al. |
| 2012/0319080 A1 | 12/2012 | Fudeta et al. |
| 2013/0056707 A1 | 3/2013 | Kozaki |
| 2013/0069034 A1 | 3/2013 | Hirayama |
| 2013/0082237 A1 | 4/2013 | Northrup et al. |
| 2014/0054542 A1 | 2/2014 | Han et al. |
| 2014/0103290 A1* | 4/2014 | Yen ................. H01L 33/06 |
| | | 257/13 |
| 2014/0131732 A1 | 5/2014 | Fu et al. |
| 2014/0203242 A1 | 7/2014 | Kozaki |
| 2014/0231840 A1 | 8/2014 | Fudeta et al. |
| 2014/0239252 A1 | 8/2014 | Hirayama |
| 2015/0137332 A1 | 5/2015 | Fu et al. |
| 2015/0364649 A1 | 12/2015 | Kozaki |
| 2016/0005919 A1 | 1/2016 | Obata |
| 2016/0149078 A1 | 5/2016 | Takeuchi et al. |
| 2016/0233375 A1 | 8/2016 | Northrup et al. |

FOREIGN PATENT DOCUMENTS

| | | | |
|---|---|---|---|
| JP | 2000-196194 | A | 7/2000 |
| JP | 2002-223042 | A | 8/2002 |
| JP | 2002-314205 | A | 10/2002 |
| JP | 2003-115642 | A | 4/2003 |
| JP | 2003-273473 | A | 9/2003 |
| JP | 2013-080925 | A | 5/2013 |
| JP | 2013-084707 | A | 5/2013 |
| JP | 2014-086729 | A | 5/2014 |
| JP | 2014-241397 | A | 12/2014 |
| JP | 2015-002324 | A | 1/2015 |
| TW | 201230389 | A1 | 7/2012 |
| TW | 201409740 | A | 3/2014 |
| TW | 201419571 | A | 5/2014 |
| WO | WO-2011/102411 | A1 | 8/2011 |
| WO | WO-2011/104969 | A1 | 9/2011 |

OTHER PUBLICATIONS

Non-Final Office Action in U.S. Appl. No. 16/546,204, dated Oct. 4, 2019.

* cited by examiner

NITRIDE SEMICONDUCTOR LIGHT EMITTING ELEMENT INCLUDING ELECTRON BLOCKING STRUCTURE LAYER

CROSS-REFERENCE TO RELATED APPLICATIONS

The present application is a U.S. national stage application of International Patent Application No. PCT/JP2016/077888, filed on Sep. 21, 2016, which claims priority to Japanese Patent Application No. 2015-190294, filed on Sep. 28, 2015. The contents of these applications are hereby incorporated by reference in their entireties.

TECHNICAL FIELD

The present invention relates to nitride semiconductor light emitting elements, particularly those nitride semiconductor light emitting elements which emit deep ultraviolet light.

DISCUSSION OF THE RELATED ART

Nitride semiconductors, including GaN, are direct transition type semiconductors, and three-element mixed crystal and four-element mixed crystal which include Al and In can emit light ranging from the infrared to deep ultraviolet by appropriately setting the composition to vary the bandgap. Since nitride semiconductor light emitting elements which use a nitride semiconductor containing Al having a large bandgap as its active layer can particularly be configured to emit deep ultraviolet light having a wavelength in a range between 220 and 350 nm by appropriately setting the Al composition, their practical use as deep ultraviolet light sources, e.g., LEDs or LDs, is promising.

For example, Patent Literature 1 discloses a nitride semiconductor light emitting element with an improved emission efficiency by forming an electron blocking layer on the active layer composed of a nitride semiconductor containing Al having a large bandgap.

CONVENTIONAL ART DOCUMENT

Patent Literature

Patent Literature 1: WO2011/104969

EFFECT OF THE INVENTION

Problem to be Solved by the Invention

However, conventional nitride semiconductor light emitting elements using a large bandgap nitride semiconductor containing Al as the active layer tend to have a shorter service life than blue LEDs and the like.

Accordingly, one object of the embodiments of the present invention is to provide a long service life nitride semiconductor light emitting element configured with a large bandgap Al-containing nitride semiconductor as an active layer.

Means to Solve the Problem

The nitride semiconductor light emitting element according to one embodiment of the invention comprises: an n-side layer, a p-side layer, and an active layer disposed between the n-side layer and the p-side layer comprising a well layer containing Al, Ga, and N, and a barrier layer containing Al, Ga, and N where the Al content is higher than that of the well layer, wherein the nitride semiconductor light emitting element has an electron blocking structure layer between the active layer and the p-side layer, and the electron blocking structure includes a first electron blocking layer having a bandgap larger than that of the barrier layer, a second electron blocking layer disposed between the p-side layer and the first electron blocking layer and having a bandgap larger than that of the barrier layer, but smaller than that of the first electron blocking layer, and an intermediate layer disposed between the first electron blocking layer and the second electron blocking layer and having a bandgap smaller than that of the second electron blocking layer.

EFFECT OF THE INVENTION

Having an intermediate layer between the first electron blocking layer and the second electron blocking layer, the nitride semiconductor light emitting element of the embodiment of the invention constructed as above can provide a nitride semiconductor light emitting element constructed with a large bandgap Al-containing nitride semiconductor as an active layer having a long service life.

DETAILED DESCRIPTION OF EMBODIMENTS

The nitride semiconductor light emitting element according to certain embodiments of the invention will be explained below with reference to drawings. The present invention, however, is not limited to the embodiments described below.

Embodiments

Figure 1:
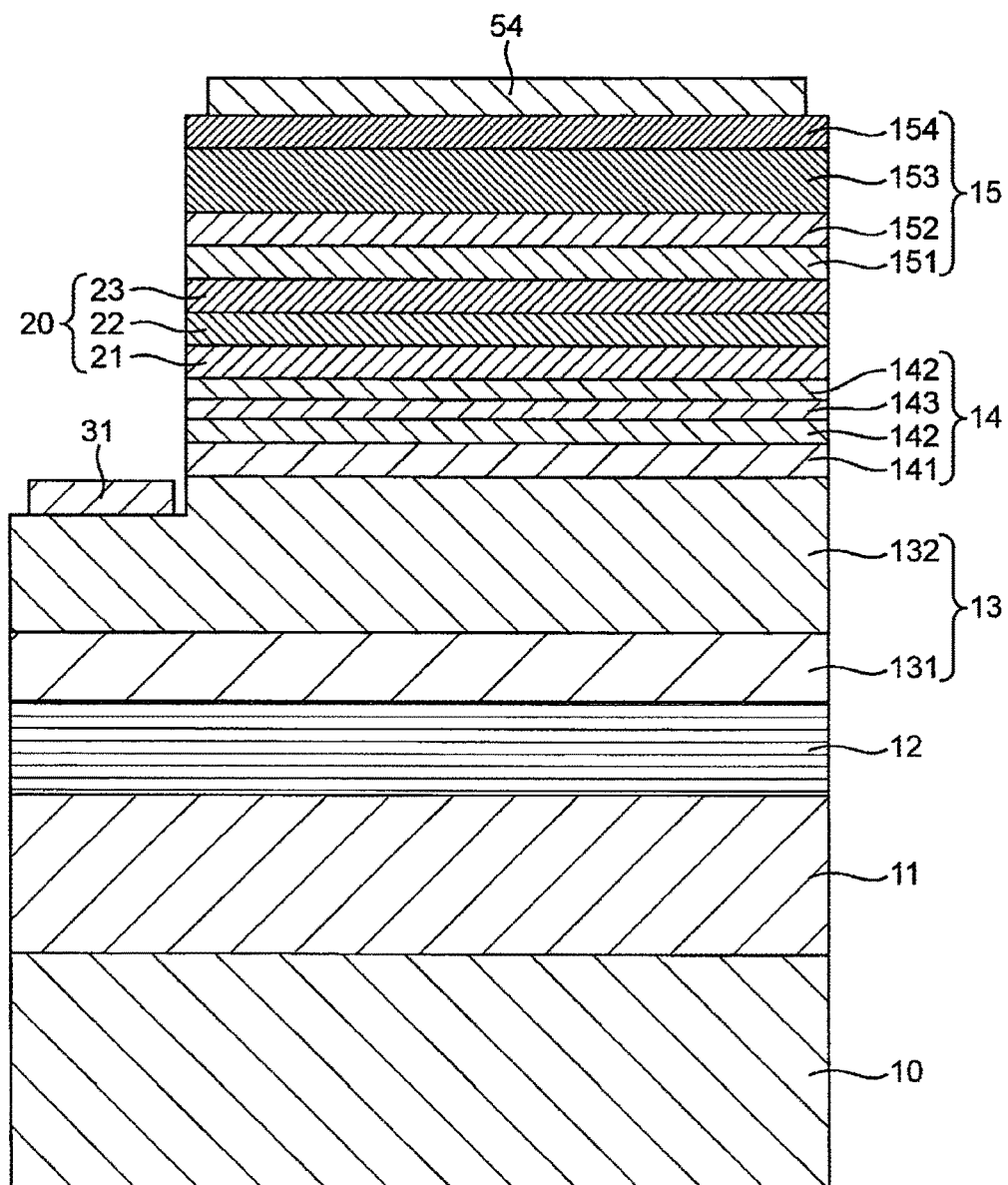
FIG. 1 is a schematic sectional view showing the structure of the nitride semiconductor light emitting element according to one embodiment of the present invention.

The nitride semiconductor light emitting element of the embodiment shown in FIG. 1 includes on a substrate 10, an n-side layer 13, a p-side layer 15, and an active layer 14 disposed between the n-side layer 13 and the p-side layer 15, and is structured to emit, for example, deep ultraviolet light in a range between 220 nm and 350 nm. In the nitride semiconductor light emitting element of this embodiment, the active layer 14 has a quantum well structure including, for example, a well layer 142 containing Al, Ga, and N, and barrier layers 141 and 143 containing Al, Ga, and N. In the active layer 14, the well layer 142 has, for example, an aluminum composition x set to result in the bandgap corresponding to a given deep ultraviolet light wavelength, and the barrier layers 141 and 143 have, for example, an aluminum composition x set to result in a larger bandgap than that of the well layer 142.

For example, in the nitride semiconductor light emitting element which emits deep ultraviolet light having a peak wavelength of 280 nm, the well layer 142 is constructed, for example, with a nitride semiconductor having an aluminum composition x of 0.45, i.e., Al0.45Ga0.55N, while constructing the barrier layers 141 and 143 with a nitride semiconductor having an aluminum composition y of 0.56, i.e., Al0.56Ga0.44N.

In this specification, a three-element mixed crystal nitride semiconductor containing Al, Ga, and N is occasionally simply referred to as AlGaN.

The nitride semiconductor light emitting element of this embodiment, moreover, has an electron blocking structure layer 20 disposed between the p-side layer 15 and the active layer 14 to prevent the electrons injected from the n-side layer 13 into the active layer 14 from flowing out into the p-side layer without recombining in the well layer 142.

Here, in the nitride semiconductor light emitting element of this embodiment, in particular, the electron blocking structure layer 20 includes:
(i) a first electron blocking layer 21 having a larger bandgap than that of the barrier layer 141 or 143, which is disposed on the active layer 14 side,
(ii) a second electron blocking layer 23 having a bandgap larger than that of the barrier layer 141 or 143, but smaller than that of the first electron blocking layer 21, which is disposed on the p-side layer 15 side, and
(iii) an intermediate layer (load reducing layer) 22 between the first electron blocking layer 21 and the second electron blocking layer 23 having a smaller bandgap than that of the first electron blocking layer 21 and the second electron blocking layer 23.

Having the first electron blocking layer 21 and the second electron blocking layer 23 as described above, the electron blocking structure layer 20 can improve the effectiveness of blocking electrons, i.e., can increase the efficiency of electron injection into the active layer 14 by reducing an electron overflow, thereby increasing the emission efficiency. On the other hand, the strong electric field created by the electron blocking effect conceivably degrades the second electron blocking layer 23. In this embodiment, however, the intermediate layer 22 included in the electron blocking structure layer 20 can reduce the degradation of the second electron blocking layer 23. More specifically, it is believed that the holes which have migrated through the second electron blocking layer 23 are blocked by the first electron blocking layer 21 and remain in the intermediate layer 22 closer to the electron-rich active layer 14, which consequently moderates the electric field applied to the second electron blocking layer 23. Accordingly, the nitride semiconductor light emitting element of this embodiment which has an electron blocking structure layer 20 can increase the emission efficiency, as well as extending the service life.

The electron blocking structure layer 20 may include an additional layer between the first electron blocking layer 21 and the active layer 14, and another layer between the second electron blocking layer 23 and the p-side layer 15, as long as it achieves electron blocking effects. In the nitride semiconductor light emitting element according to this embodiment, however, the first electron blocking layer 21 is preferably in contact with the active layer 14. This allows the first electron blocking layer 21 to achieve high levels of electron blocking effects. In the case where the first electron blocking layer 21 is in contact with the active layer 14, the first electron blocking layer 21 may be in contact with either the well layer or the barrier layer. Moreover, the second electron blocking layer 23 is preferably in contact with the p-side layer 15. This can attenuate the decline in the electron hole injection efficiency into the active layer 14, thereby attenuating the optical output decline. Furthermore, the electron blocking structure layer may include an additional layer between the intermediate layer 22 and the first electron blocking layer 21, and between the intermediate layer 22 and the second electron blocking layer 23, as long as it can attenuate the degradation of the second electron blocking layer 23. In this embodiment, however, the intermediate layer 22 preferably is in contact with the first electron blocking layer 21 or the second electron blocking layer 23, more preferably is in contact with both the first electron blocking layer 21 and the second electron blocking layer 23. Bringing the intermediate layer 22 into contact with one, or preferably both, of the first electron blocking layer 21 and the second electron blocking layer 23 can more effectively moderate the application of an electric field to the second electron blocking layer 23, thereby improving the effectiveness of attenuating the degradation of the second electron blocking layer 23.

Since the electron blocking structure layer 20 according to this embodiment is constructed with the first electron blocking layer 21, the intermediate layer 22, and the second electron blocking layer 23, good electron blocking effects can be achieved even when the first electron blocking layer 21 is thinner than the second electron blocking layer 23. Making the first electron blocking layer 21 thinner than the second electron blocking layer 23 allows electrons to pass through the first electron blocking layer 21 by tunneling effects and reach the active layer. This allows the intermediate layer to retain electron holes while preventing emissions in the intermediate layer, which can reduce the electric field concentration in the second electron blocking layer 23, thereby attenuating the degradation of the second electron blocking layer 23. Moreover, forming the first electron blocking layer 21 which has a large bandgap with a small thickness can enhance the electron blocking effect while attenuating a forward voltage increase.

An excessively thick first electron blocking layer 21 can increase the distortion occurring in the bandgap of the well layer, and thus facilitates concentration of the electric field. In other words, because the bandgap becomes small, most of radiative recombination occurs in this small bandgap part. This consequentially concentrates the electric field and shortens the service life of the light emitting element. From this perspective also, the first electron blocking layer 21 preferably has a small thickness. An excessively thin first electron blocking layer 21, however, can reduce the electron blocking effects to thereby reduce the effect of attenuating the degradation of the second electron blocking layer 23. Furthermore, by making the thickness of the intermediate layer 22 smaller than the thickness of the second electron blocking layer 23, emissions by the intermediate layer 22 can be more effectively prevented while preventing an electric field from concentrating in the second electron blocking layer 23. The combined thickness of the first electron blocking layer 21 and the intermediate layer 22 is preferably smaller than the thickness of the second electron blocking layer 23.

The first electron blocking layer 21 can be constructed with a nitride semiconductor $Al_{z1}Ga_{1-z1}N$ having, for example, an aluminum composition z1 that is higher than the aluminum composition y of the barrier layers 141 and 143. For the first electron blocking layer 21, the higher the aluminum composition z1, the more preferable it is in order to enhance the electron blocking effect, more preferably an aluminum composition z1 of 1, AlN, is used to compose the layer.

The second electron blocking layer 23 can be constructed with a nitride semiconductor $Al_{Z2}Ga_{1-Z2}N$ having, for example, an aluminum composition z2 that is higher than the aluminum composition Y of the barrier layers 141 and 143, but lower than the aluminum composition Z1 of the first electron blocking layer 21. When the well layer 142 is constructed with a nitride semiconductor composed of $Al_{0.45}Ga_{0.55}N$, the barrier layers 141 and 143 constructed with a nitride semiconductor composed of $Al_{0.56}Ga_{0.44}N$, and the first electron blocking layer 21 with AlN, the second electron blocking layer 23 is constructed, for example, with a nitride semiconductor having an aluminum composition z2 of 0.78, i.e., $Al_{0.78}Ga_{0.22}N$.

The intermediate layer 22 can be constructed with a nitride semiconductor $Al_rGa_{1-r}N$ having, for example, an aluminum composition r that is lower than the aluminum composition Z2 of the second electron blocking layer 23, preferably lower than the aluminum composition Y of the barrier layer 141 or 143, and is preferably constructed with a nitride semiconductor $Al_rGa_{1-r}N$ having an aluminum composition r that is equal to or higher than the aluminum composition X of the well layer 142.

In the nitride semiconductor light emitting element of this embodiment, the electron blocking structure layer 20 can assume various forms described below so long as it satisfies the conditions (i) to (iii) specified above. Examples of the electron blocking structure layer 20 will be explained below with reference to FIG. 2 and FIG. 3.

Figure 2:
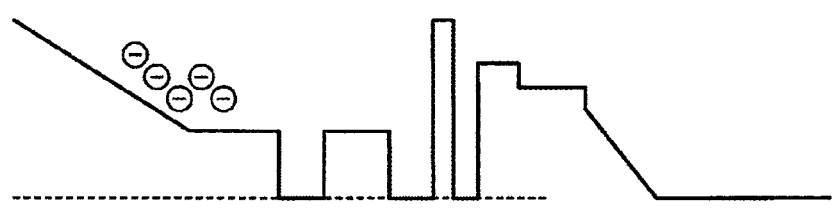
FIG. 2 is a diagram schematically showing the band structure of the electron blocking structure layer 20 of Form 1 of the nitride semiconductor light emitting element according to the embodiment.
Figure 2:
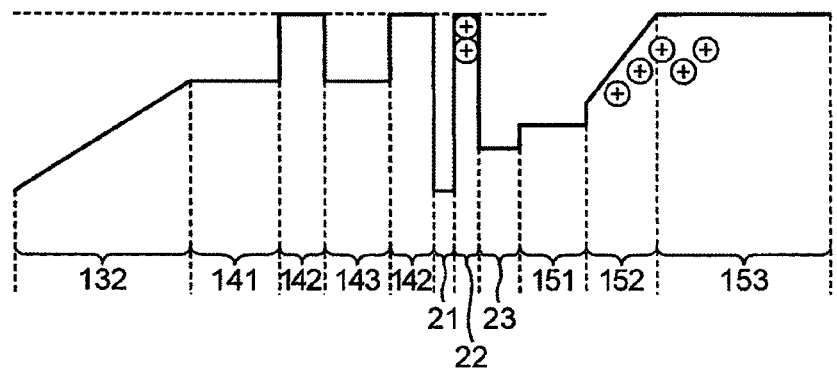
Figure 3:
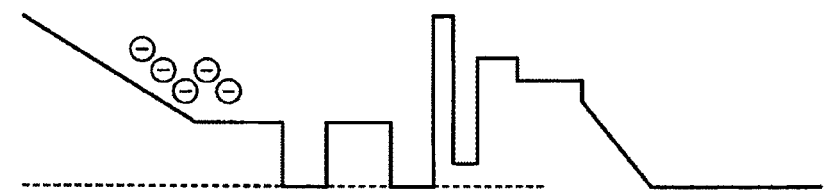
FIG. 3 is a diagram schematically showing the band structure of the electron blocking structure layer 20 according to Form 2 of the nitride semiconductor light emitting element according to the embodiment.
Figure 3:
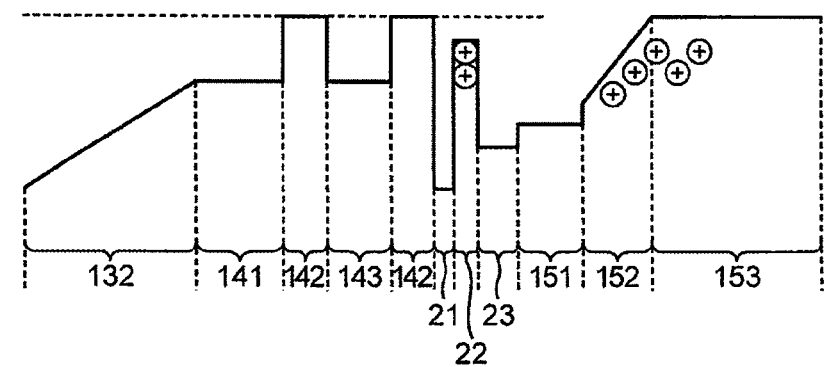

FIG. 2 and FIG. 3 respectively show the band structures of the electron blocking structure layer 20 of Forms 1 and 2. FIG. 2 and FIG. 3 also include the later described n-side second composition gradient layer 132, active layer 14, p-side clad layer 151, p-side composition gradient clad layer 152, and p-side low concentration doped layer 153.

Electron Blocking Structure Layer 20 of Form 1

FIG. 2 shows the band structure of the electron blocking structure layer 20 of Form 1.

In the electron blocking structure layer 20 of Form 1, the bandgap of the intermediate layer 22 is set the same as the bandgap of the well layer 142. For example, when the well layer 142 is constructed with a nitride semiconductor of $Al_xGa_{1-x}N$, the intermediate layer 22 is constructed with a nitride semiconductor of $Al_rGa_{1-r}N$ in which the aluminum composition r is the same as the aluminum composition x of the well layer 142.

According to the electron blocking structure layer 20 of Form 1 described above, the intermediate layer 22 can reduce the load applied to the second electron blocking layer 23, and can consequently attenuate the service life decline attributable to the degradation of the second electron blocking layer 23.

Electron Blocking Structure Layer 20 of Form 2

FIG. 3 shows the band structure of the electron blocking structure layer 20 of Form 2.

In the electron blocking structure layer 20 of Form 2, the bandgap of the intermediate layer 22 is set larger than the bandgap of the well layer 142, but smaller than the bandgap of the barrier layer 141 or 143. For example, when the well layer 142 is constructed with a nitride semiconductor of $Al_xGa_{1-x}N$ and the barrier layers 141 and 143 are constructed with a nitride semiconductor of $Al_yGa_{1-y}N$, the intermediate layer 22 is constructed with a nitride semiconductor of $Al_rGa_{1-r}N$ in which the aluminum composition r is larger than the aluminum composition x of the well layer 142, but smaller than the aluminum composition y of the barrier layer 141 or 143.

The electron blocking structure layer 20 of Form 2 described above can further reduce the decline in the carrier injection efficiency into the well layer 142, as well as reducing the load applied to the second electron blocking layer 23 as in the case of Form 1.

In each of the electron blocking structure layers 20 of Forms 1 and 2 described above, the bandgap of the intermediate layer 22 was set smaller than the bandgap of the barrier layer 141 or 143. However, the embodiments of the invention are not limited to this, and the bandgap of the intermediate layer 22 can be the same as, or larger than, the bandgap of the barrier layer 141 or 143, so long as it is smaller than those of the first electron blocking layer 21 and the second electron blocking layer 23.

P-Type Impurities in the Electron Blocking Structure Layer 20

The electron blocking structure layer 20 contains p-type impurities as needed because it is a layer disposed between the active layer 14 and the p-side layer 15. In this embodiment, however, it is preferable for at least one of the first electron blocking layer 21, the intermediate layer 22, and the second electron blocking layer 23 to be a non-doped layer. Including at least one non-doped layer in the electron blocking structure layer 20 can reduce the p-type impurities diffused in the well layer 142, thereby moderating the service life reduction.

In this embodiment, moreover, it is more preferable to make the first electron blocking layer 21 a non-doped layer. Having non-doped first electron blocking layer 21 can further reduce the p-type impurities diffused in the well layer 142 to more effectively moderate the service life reduction.

A non-doped layer herein refers to a layer which is formed without doping with p-type or n-type impurities while the layer is allowed to grow, for example, when growing the layer by organometallic vapor deposition, the supply of raw material gas for the impurities is suspended, and means that the impurity concentration is 1×10-16 at most, i.e., the layer contains no impurities in effect.

Figure 5:
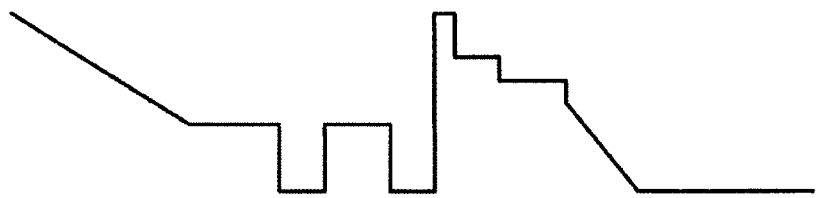
FIG. 5 is a diagram schematically showing the band structure of the electron blocking structure in the nitride semiconductor light emitting element of a conventional example.
Figure 5:
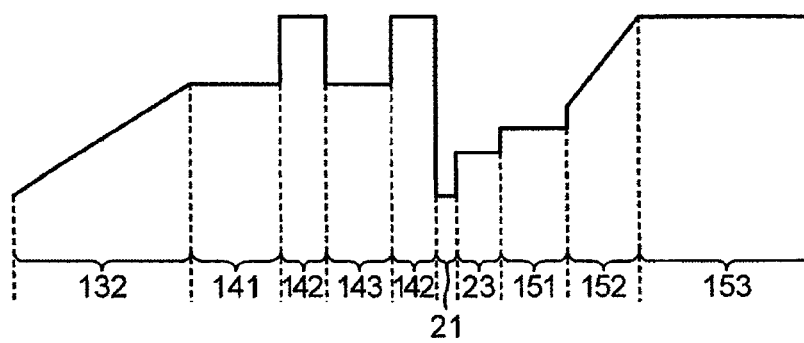

The electron blocking structure layer 20 structured as above can reduce the load applied to the electron blocking structure layer 20 and thus can moderate the deterioration of the electron blocking structure layer 20, as compared to the electron blocking structure shown in FIG. 5 which is structured with two layers, the first electron blocking layer 21 and the second electron blocking layer 23, without an intermediate layer 22.

Accordingly, the nitride semiconductor light emitting element having the electron blocking structure layer 20 of this embodiment can extend the service life as compared to the nitride semiconductor having a two-layer electron blocking structure composed of the first electron blocking layer 21 and the second electron blocking layer 23.

Figure 4:
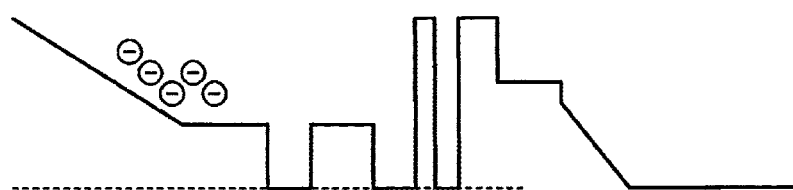
FIG. 4 is a diagram schematically showing the band structure of the electron blocking structure in the nitride semiconductor light emitting element of a reference example.
Figure 4:
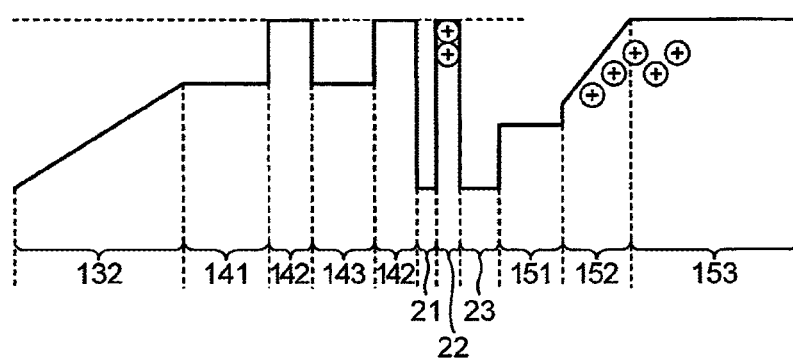

The electron blocking structure layer 20 structured as above can increase the emission intensity as compared to the nitride semiconductor light emitting element of the reference example shown in FIG. 4 where the first electron blocking layer 21 and the second electron blocking layer 23 have the same bandgap.

In other words, the nitride semiconductor light emitting element having the electron blocking structure layer 20 of this embodiment can increase both the emission intensity and the service life.

In the nitride semiconductor light emitting element of this embodiment, the intermediate layer 22 has a bandgap that is the same as, or higher than that of the well layer 142. Accordingly, when the emission wavelength is set to 250 nm or higher, the bandgaps can be set with a large difference between the intermediate layer 22 and both the first electron blocking layer 21 and the second electron blocking layer 23. As a result, the load reducing effect of the intermediate layer 22 becomes more apparent. Moreover, when the emission wavelength is set to 310 nm or lower, the electric field resulting from the electron blocking effect of the first electron blocking layer 21 and the second electron blocking layer 23 intensifies further. Thus, the intermediate layer 22 can more effectively exert the load reducing effect. Accordingly, in the nitride semiconductor light emitting element of this embodiment, setting the emission wavelength in a range between 250 nm and 310 nm can more effectively moderate the degradation of the electron blocking structure layer 20.

In the nitride semiconductor light emitting element of this embodiment, the first electron blocking layer 21 is disposed in contact with the well layer 142. Disposing the first electron blocking layer 21 in contact with the well layer 142 in this way can effectively reduce the electron overflow.

However, in the nitride semiconductor light emitting element of this embodiment, a barrier layer can be disposed as the p layer side outermost layer of the active layer 14 to dispose the first electron blocking layer 21 in contact with the barrier layer. Disposing the first electron blocking layer 21 in contact with the outermost barrier layer in this way can effectively reduce the diffusion of the p-type impurities into the well layer 142.

In the nitride semiconductor light emitting element of this embodiment, moreover, another layer may be disposed as needed between the active layer 14 and the first electron blocking layer 21.

The components other than the electron blocking structure layer 20 in this embodiment will be explained in detail below.

Substrate 10

For the substrate 10, a sapphire substrate, for example, can be used. A sapphire substrate is transparent to deep ultraviolet light, and is suitable as a substrate for a nitride semiconductor light emitting element which emits deep ultraviolet light. A sapphire substrate having c-plane, more preferably a plane inclined to c-plane in a direction of a-axis or m-axis at an angle in a range between 0.2 and 2 degrees, as the upper face is suited for nitride semiconductor growth.

Buffer Layer 11

The buffer layer 11 is made, for example, of aluminum nitride (AlN) grown on the upper face of the substrate 10, and buffers the lattice mismatch between the sapphire and the nitride semiconductor layer grown thereon. Aluminum nitride has an extremely large bandgap and is transparent to deep ultraviolet, and thus is suited in the case where deep ultraviolet light is extracted from the sapphire substrate side. During the early stage of growing the buffer layer 11, numerous defects attributable to the lattice mismatch with the sapphire substrate and the difference in the thermal expansion coefficient can occasionally be introduced. Accordingly, the buffer layer 11 is preferably formed to a certain thickness, for example, to a thickness of at least 2 μm. There is no particular upper limit for the thickness of the buffer layer 11, but is set, for example, to 4 μm at most so as not to reduce productivity. The buffer layer 11 (aluminum nitride) is preferably a single crystal. Single crystal aluminum nitride has increased c-axis orientability, which improves the crystal orientation of the active layer 14, thereby increasing the emission efficiency.

Superlattice Layer 12

Formed by alternatingly stacking a first layer having a small lattice constant and a second layer having a larger lattice constant than that of the first layer into a periodic multilayer structure, the superlattice layer 12 buffers the stress that will be applied to the upper layers formed thereon. This can prevent cracks from occurring in the first composition gradient layer 131. The superlattice layer 12 is constructed, for example, by alternatingly stacking an aluminum nitride (AlN) layer and an aluminum gallium nitride (AlGaN) layer.

The lowermost layer of the superlattice layer 12 in contact with the buffer layer 11 may be either an aluminum nitride (AlN) layer or an aluminum gallium nitride (AlGaN) layer. The uppermost layer of the superlattice layer 12 in contact with the first composition gradient layer 131 may also be either an aluminum nitride (AlN) layer or an aluminum gallium nitride (AlGaN) layer. The aluminum nitride layer and/or aluminum gallium nitride layer, moreover, may be doped with an additive element, such as n-type impurities, in accordance with a given objective. In the case of extracting deep ultraviolet light from the sapphire substrate 10 side, the composition of the aluminum gallium nitride layer is adjusted so as to have a larger bandgap than the photon energy of the deep ultraviolet light emitted from the active layer.

N-Side Layer 13

The n-side layer 13 includes a first composition gradient layer 131 and a second composition gradient layer 132.

First Composition Gradient Layer 131

The first composition gradient layer 131 is a layer whose composition continuously changes from the superlattice layer side to the second composition gradient layer side, i.e., in the direction towards the top, and is formed, for example, in contact with the upper face of the superlattice layer. The first composition gradient layer 131 can improve the crystallinity of the second composition gradient layer 132 formed in contact with the fist composition gradient layer 131.

The first composition gradient layer 131 is made, for example, of undoped aluminum gallium nitride, and the aluminum ratio mAl1 in the aluminum gallium nitride ($Al_{mAl1}Ga_{1-mAl1}N$) successively or gradually decreases in the direction towards the top. Moreover, the aluminum ratio mAl1 is defined by the ratio of aluminum to the sum of the gallium and aluminum in the aluminum gallium nitride. Moreover, in the case of extracting deep ultraviolet light from the sapphire substrate 10 side, the minimum value of the mAl1 is adjusted so that the first composition gradient layer as a whole is transparent to the deep ultraviolet light emitted from the active layer.

Second Composition Gradient Layer 132

The second composition gradient layer 132 is a layer whose composition continuously changes from the first composition gradient layer 131 side to the active layer 14 side, and is formed in contact with the upper face of the first composition gradient layer 131. The second composition gradient layer 132 is made, for example, of an n-type impurity doped aluminum gallium nitride, and the aluminum ratio mAl2 in the aluminum gallium nitride (AlmAl2Ga1-mAl2N) successively or gradually decreases in the direction towards the top. Such a second composition gradient layer 132 can make the portion where the n electrode is disposed low in Al composition. Making it a low Al composition can better activate the n-type impurities, thereby reducing the contact resistance between the n electrode and the second composition gradient layer 132. Here, the n-type impurities, for example, is silicon.

Moreover, in the case of extracting deep ultraviolet light from the sapphire substrate 10 side, the minimum value of the mAl2 is adjusted so that the second composition gradient layer as a whole is transparent to the deep ultraviolet light emitted from the active layer.

Relationship Between the First and Second Composition Gradient Layers

The compositions of the first composition gradient layer 131 and the second composition gradient layer 132, as well as how the compositions change can be set independently from one another. However, the aluminum ratio mAl1 at the upper face of the first composition gradient layer 131 (hereinafter referred to as mAl1u) is preferably equal to or greater than the aluminum ratio mAl2 at the bottom face of the second composition gradient layer 132 (hereinafter referred to as mAl2b), as this will apply compression stress to the entire second composition gradient layer 132 which reduces the occurrences of cracks. It is more preferable to set the values to satisfy the relationship, mAl1u>mAl2, while making the difference between mAl1u and mAl2b relatively small, as this prevents the occurrence of defects at the interface caused by the lattice mismatch. The preferable range of the mAl1u/mAl2b ratio is 1.00 or higher but 1.02 or lower. Moreover, the first composition gradient layer 131 and the second composition gradient layer 132 form the n-side layer 13, and the n electrode 31 is formed in contact with the upper face of the first composition gradient layer 131.

Active Layer 14

The active layer 14 formed on the upper face of the second composition gradient layer 132 has a well layer 142 and barrier layers 141 and 143 made, for example, of group III nitride semiconductor which emits deep ultraviolet light. The well layer 142 and the barrier layers 141 and 143 can be constructed, for example, with a group III nitride represented by the general formula InaAlbGa1-a-bN (0≤a≤0.1, 0.4≤≤1.0, a+b 1.0). In the case of achieving a nitride semiconductor light emitting element which emits deep ultraviolet light of 280 nm peak wavelength in this embodiment, a three-element nitride semiconductor of AlxGa1-xN, for example, can be selected to construct the well layer 142, and the aluminum composition x of 0.45, i.e., a nitride semiconductor Al0.45Ga0.55N can be used. In this case, a three-element nitride semiconductor of AlyGa1-yN, for example, can be selected to construct the barrier layers 141 and 143, and the aluminum composition y of 0.56, i.e., a nitride semiconductor Al0.56Ga0.44N can be used. FIG. 1 illustrates an active layer 14 which includes two well layers 142 and two barrier layers 141 and 143, more specifically, the barrier layer 141 in contact with the second composition gradient layer 132, the well layer 142, the barrier layer 143, and the well layer 142 stacked in this order towards the electron blocking structure layer 20.In the active layer 14, moreover, the thickness of each layer is set, for example, to 50 nm for the barrier layer 141, 2.5 nm for the barrier layer 143, and 4.4 nm for the well layer 142. In FIG. 1, the active layer 14 is disposed by forming the barrier layer 141 as the lowermost layer so that the barrier layer 141 comes into contact with the second composition gradient layer 132, as well as forming the well layer 142 as the uppermost layer so that the well layer 142 comes into contact with the first electron blocking layer 21. The active layer 14 constructed in this way can reduce the electron overflow and promote the diffusion of holes into the active layer 14.

However, in this embodiment, the well layers and the barrier layers can be arranged in the active layer 14 in various ways in accordance with a given objective, and for example, a barrier layer can alternatively be formed as the uppermost layer, and a well layer can be formed as the lowermost layer.

In this embodiment, moreover, the active layer 14 is not limited to a multi-quantum well structure which includes two or more well layers, but can be a single quantum well structure, or is not required to be a quantum well structure.

P-Side Layer 15

The p-side layer 15 includes a p-side clad layer 151, a p-side composition gradient clad layer 152, a p-side low concentration doped layer 153, and a p-side contact layer 154, which are constructed so that their bandgaps phase down or gradually become smaller as it becomes more distant from the electron blocking structure layer 20.Constructing it to increase the bandgap towards the electron blocking structure layer 20 in this way can facilitate the migration of holes in the p-side low concentration doped layer 153 through the p-side composition gradient clad layer 152, thereby efficiently supplying the holes to the active layer.

P-Side Clad Layer 151

The p-side clad layer 151 is constructed to have a smaller bandgap than that of the second electron blocking layer 23, and for example, made of an AlGaN layer having a smaller aluminum ratio than that of the second electron blocking layer 23. When constructing the second electron blocking layer 23 with a nitride semiconductor having an aluminum ratio of 0.78, Al0.78Ga0.22N, for example, the p-side clad layer 151 can be constructed with a nitride semiconductor, for example, Al0.63Ga0.37N.

P-Side Composition Gradient Clad Layer 152

The p-side composition gradient clad layer 152 is constructed with a gradually smaller bandgap as it becomes more distant from the p-side clad layer 151. For example, when constructing the p-side clad layer 151 with a nitride semiconductor Al0.63Ga0.37N, and the p-side low concentration doped layer 153 is constructed with GaN, the p-side composition gradient clad layer 152 can be constructed with AlmAl3Ga1-mAl3N, successively decreasing the aluminum ratio mAl3 from Al0.63Ga0.37N to GaN. This facilitates the migration of the holes in the p-side low concentration doped layer 153 through the p-side composition gradient clad layer 152 to efficiently supply the holes to the active layer.

P-Side Low Concentration Doped Layer 153

The p-side low concentration doped layer 153 is made, for example, of GaN, and plays a role of laterally diffusing the current.

P-Side Contact Layer 154

The p-side contact layer 154 is made, for example, of GaN, and contains p-type impurities at a higher concentration than that of the p-side low concentration doped layer 153. For the p-type impurities, magnesium is preferably used.

The invention will be explained in greater detail below using examples.

EXAMPLES

Example 1

On the c-plane upper face of a sapphire substrate 10, 7.62 cm (3 inches) in diameter, a buffer layer 11 made of aluminum nitride of 3.5 µm in thickness was formed.

Next, the substrate 10 with the buffer layer 11 formed thereon was placed in a reaction vessel, and a buffer layer of a single crystal aluminum nitride of about 0.1 µm in thickness was allowed to grow by using ammonia and trimethylaluminum (TMA) as raw material gasses.

Continuing on, an $Al0.7Ga0.3N$ layer (layer a) of about 27.0 nm in thickness was formed using ammonia, TMA, and trimethylgallium (TMG). Then, an AlN layer (layer b) of about 10.2 nm in thickness was formed by using ammonia and TMA while suspending the introduction of TMG. The layers a and layers b were alternatingly formed 30 times each to form a superlattice layer 12.

Then, a first composition gradient layer 131, which was undoped and its mAl1 successively decreased from $Al0.7Ga0.3N$ to $Al0.56Ga0.44N$ in the direction towards the top, was formed to a thickness of 500 nm by using ammonia, TMA, and TMG.

Continuing on, a second composition gradient layer 132, which was silicon doped and its mAl2 successively decreased from $Al0.56Ga0.44N$ to $Al0.45Ga0.55N$ in the direction towards the top, was formed to a thickness of 2500 nm using ammonia, TMA, TMG, and monosilane.

After forming the second composition gradient layer 132, all gases were stopped, and the conditions inside the reaction vessel were adjusted to 970° C. and 26.7 kPa (200 Torr). After the adjustments, a silicon doped $Al0.56Ga0.44N$ barrier layer 141 was formed to about 50.0 nm in thickness using ammonia, TMA, triethylgallium (TEG), and monosilane.

Then, an $Al0.45Ga0.55N$ well layer 142 was formed to about 4.4 nm in thickness using ammonia, TMA, and TEG, suspending the introduction of monosilane. Continuing on, a silicon doped $Al0.56Ga0.44N$ barrier layer 143 was formed to about 2.5 nm in thickness using ammonia, TMA, TEG, and monosilane. Next, an $Al0.45Ga0.55N$ well layer 142 of about 4.4 nm in thickness was formed using ammonia, TMA, and TEG, suspending the introduction of monosilane.

The active layer 14 was formed as above.

After forming the active layer, all gasses were stopped, and the conditions within the reaction vessel were adjusted to 870° C. and 13.3 kPa. After the adjustment, a first electron blocking layer 21 made of p-type impurity (Mg) doped aluminum nitride of about 1.0 nm in thickness was formed using ammonia and TMA.

Next, an $Al0.45Ga0.55N$ intermediate layer 22 of about 1.0 nm in thickness was formed using ammonia, TMA, and TMG (or TEG).

Continuing on, a p-type impurity doped $Al0.78Ga0.22N$ second electron blocking layer 23 of about 4.0 nm in thickness was formed using ammonia, TMA, and TMG (or TEG).

Continuing on, a magnesium doped $Al0.63Ga0.37N$ p-side clad layer 151 of about 78.0 nm in thickness was formed using ammonia, TMA, TMG (or TEG), and bis (cyclopntadienyl)magnesium (Cp2Mg; magnesocene).

Then, a p-side composition gradient layer 152, which is magnesium doped and its mAl3 successively decreased from $Al0.6Ga0.4N$ to GaN in the direction towards the top, was formed to a thickness of 23 nm using ammonia, TMA, TMG (or TEG), and Cp2Mg.

Continuing on, a magnesium doped gallium nitride p-side low concentration doped layer 153 of about 300.0 nm in thickness was formed using ammonia, TMG, and CP2Mg.

Then, a magnesium doped gallium nitride p-side contact layer 154 of about 15 nm in thickness was formed using ammonia, TMG, and Cp2Mg.

Exposing of N-Side Layer

A mask was formed excluding the prescribed areas so that only the prescribed areas are etched. After forming the mask, the semiconductor stack was placed in a dry etching apparatus, and etching was performed to about 0.8 µm from the p-side layer to expose the n-side layer in a prescribed region. After etching, the semiconductor stack was removed from the dry etching apparatus, and the mask was removed.

N Electrode Formation

A mask was formed so that sputtering is performed only on the exposed electrode formation area on the n-side layer. Continuing on, the semiconductor stack was placed in a sputtering apparatus, and sputtering was performed using a titanium-aluminum alloy. Subsequently, removal of the mask resulted in an n electrode at the exposed area on the upper face of the n-side layer. At this point, it was in the state where a plurality of semiconductor stacks had been formed on one wafer, and the individual semiconductor stacks shared the same n-side layer.

P Electrode Formation

A mask was formed so that sputtering is performed only on the upper face of the p-side contact layer 154. Continuingly on, the semiconductor stacks were placed in a sputtering apparatus, and sputtering was performed using ITO. Subsequently, removal of the mask resulted in a p electrode on the upper face of the p-side contact layer 154.

Separation into Pieces

Following the steps described above, the wafer was split into individual elements.

The nitride semiconductor light emitting element of Example 1 that emits deep ultraviolet light of a wavelength of 280 nm was produced as described above.

Life Test

Figure 6:
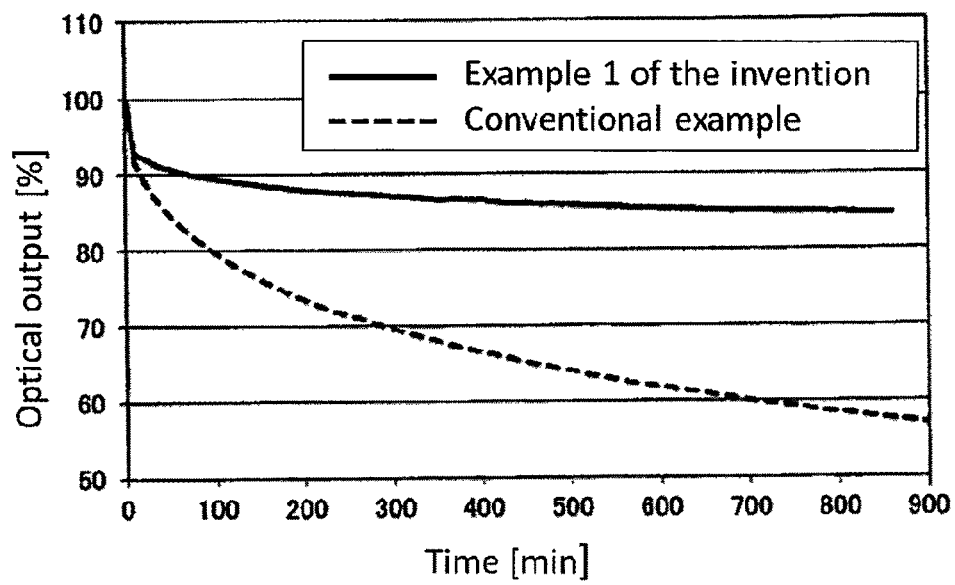
FIG. 6 is a graph showing the results of the life test conducted on Example 1 of the invention and a comparative example.

A life test was conducted on the wafer on which the semiconductor stacks were formed under the same conditions as those of Example 1 above before separation into pieces and a comparative wafer prepared under the same conditions as Example 1 except that the second electron blocking layer 22 was formed on the first electron blocking layer 21 without forming an intermediate layer 22 through continuous use while applying 150 mA under room temperature to measure the optical output (20 mA) at one minute intervals. FIG. 6 shows the results. Moreover, FIG. 6 shows the changes over time assuming that the initial output is 100%.

The nitride semiconductor light emitting elements of Example 1 were 85% even past 800 minutes, as compared to the nitride semiconductor light emitting elements of the comparative example which were below 60%, showing an improved service life for the nitride semiconductor light emitting elements of Example 1.

Example 2

Six nitride semiconductor light emitting elements (Sample No. 1-6) were prepared as Example 2 in a similar manner to the nitride light emitting elements of Example 1 except for changing the thickness of the first electron blocking layer 21, and their emission output retention rates past a certain period of time were evaluated.

The retention rates were evaluated by conducting an accelerated test. Specifically, after subjecting each light emitting element to an accelerated test by running a 150 mA electric current for 700 minutes, the optical output at 20 mA was measured, and the output retention rates before and after the test were calculated.

Figure 7:
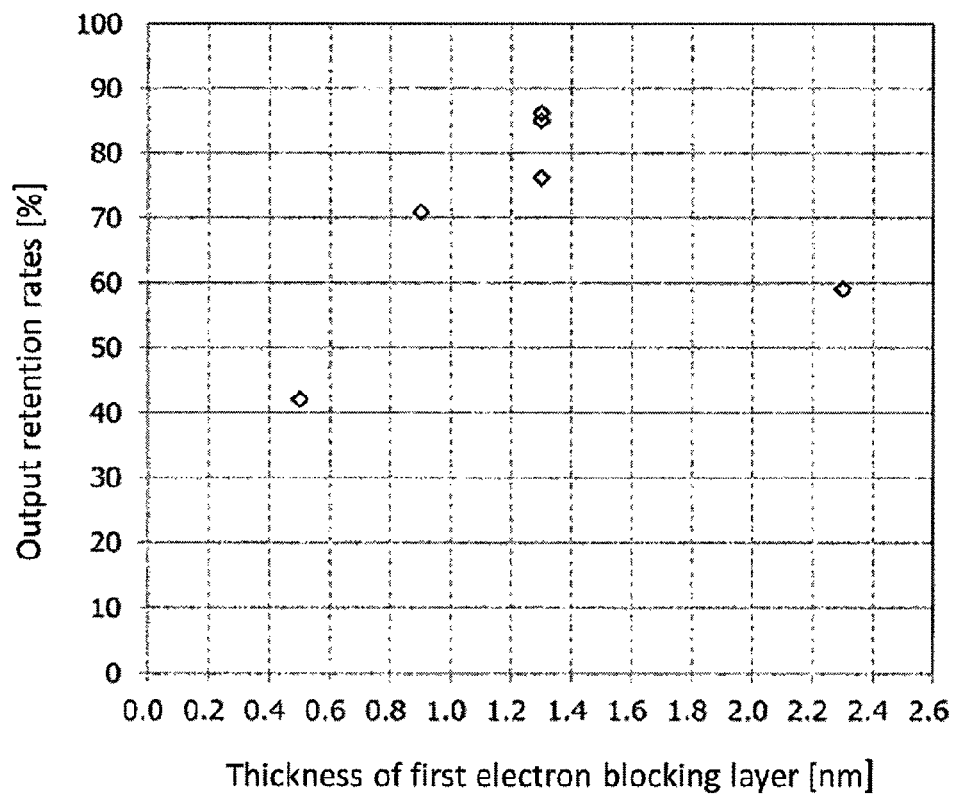
FIG. 7 is a graph showing the results of the evaluation of the emission output retention rates past a certain period of time performed on the nitride semiconductor light emitting elements of Example 2 of the invention.

FIG. 7 shows the results.

Here, the thickness of the first electron blocking layer 21 in each of the nitride semiconductor light emitting elements are shown in Table 1 below.

TABLE 1

| Sample No. | Thickness of First Electron Blocking Layer 21 (nm) |
|---|---|
| 1 | 0.5 |
| 2 | 0.9 |
| 3 | 1.3 |
| 4 | 1.3 |
| 5 | 1.3 |
| 6 | 2.3 |

From the results shown in FIG. 7, it was confirmed that when the thickness of the first electron blocking layer 21 made of AlN is in the range of from 0.9 to 2.0 nm, high levels of electron blocking effects can be achieved, and when the thickness is in the range of from 0.9 to 1.3 nm, an even higher level of electron blocking effect can be achieved.

When the first electron blocking layer 21 (AlN layer) becomes as thin as about 0.5 nm, a decline in the retention rate which is believed to be attributable to an electron blocking effect decline was observed. When the first electron blocking layer 21 (AlN layer) becomes as thick as about 2.3 nm, a decline in the retention rate was observed. This is believed to be because the distortion occurring in the bandgap of the well layer increases thereby facilitating the electric field concentration, i.e., the bandgap becomes small and allows most of radiative recombination to occur in this small bandgap part, which consequently allows the electric field to concentrate and reduce the service life of the elements.

DENOTATION OF REFERENCE NUMERALS

10 . . . substrate
11 . . . buffer Layer
12 . . . superlattice Layer
13 . . . n-side Layer
14 . . . active Layer
15 . . . p-side Layer
20 . . . electron blocking structure layer
21 . . . first electron blocking layer
22 . . . intermediate layer
23 . . . second electron blocking layer
131 . . . first composition gradient layer
132 . . . second composition gradient layer
141, 143 . . . barrier layer
142 . . . well layer
151 . . . p-side Clad Layer
152 . . . p-side composition gradient clad layer
153 . . . p-side low concentration doped layer
154 . . . p-side contact layer

What is claimed is:

1. A nitride semiconductor light emitting element comprising:
   an n-side layer;
   a p-side layer;
   an active layer disposed between the n-side layer and the p-side layer, the active layer comprising:
      a well layer containing Al, Ga, and N, and
      a barrier layer containing Al, Ga, and N,
      wherein an Al content of the barrier layer is higher than an Al content of the well layer; and
   an electron blocking structure layer between the active layer and the p-side layer, the electron blocking structure comprising:
      a first electron blocking layer disposed between the p-side layer and the active layer, wherein a bandgap of the first electron blocking layer is larger than a bandgap of the barrier layer,
      a second electron blocking layer disposed between the p-side layer and the first electron blocking layer, wherein a bandgap of the second electron blocking layer is larger than the bandgap of the barrier layer, but smaller than the bandgap of the first electron blocking layer, and
      an intermediate layer disposed between the first electron blocking layer and the second electron blocking layer, wherein a bandgap of the intermediate layer is smaller than the bandgap of the second electron blocking layer, and wherein the bandgap of the intermediate layer is smaller than the bandgap of the barrier layer.

2. The nitride semiconductor light emitting element according to claim 1, wherein the first electron blocking layer is in contact with the well layer.

3. The nitride semiconductor light emitting element according to 1, wherein a thickness of the first electron blocking layer is smaller than a thickness of the second electron blocking layer.

4. The nitride semiconductor light emitting element according to 2, wherein a thickness of the first electron blocking layer is smaller than a thickness of the second electron blocking layer.

5. The nitride semiconductor light emitting element according to claim 1, wherein a thickness of the intermediate layer is smaller than a thickness of the second electron blocking layer.

6. The nitride semiconductor light emitting element according to claim 2, wherein a thickness of the intermediate layer is smaller than a thickness of the second electron blocking layer.

7. The nitride semiconductor light emitting element according to claim 3, wherein a thickness of the intermediate layer is smaller than a thickness of the second electron blocking layer.

8. The nitride semiconductor light emitting element according to claim 1, wherein the bandgap of the intermediate layer is the same as or greater than the bandgap of the well layer.

9. The nitride semiconductor light emitting element according to claim 2, wherein the bandgap of the intermediate layer is the same as or greater than the bandgap of the well layer.

10. The nitride semiconductor light emitting element according to claim 8, wherein an emission peak wavelength of the nitride semiconductor light emitting element is in a range between 250 and 310 nm.

11. The nitride semiconductor light emitting element according to claim 10, wherein the first electron blocking layer is made of AlN.

12. The nitride semiconductor light emitting element according to claim 10, wherein the intermediate layer is made of AlGaN.

13. The nitride semiconductor light emitting element according to claim 11, wherein the intermediate layer is made of AlGaN.

14. The nitride semiconductor light emitting element according to claim 10, wherein the second electron blocking layer is made of AlGaN.

15. The nitride semiconductor light emitting element according to claim 11, wherein the second electron blocking layer is made of AlGaN.

16. The nitride semiconductor light emitting element according to claim 12, wherein the second electron blocking layer is made of AlGaN.

17. The nitride semiconductor light emitting element according to claim 12, wherein the thickness of the first electron blocking layer is 0.9 to 2.0 nm.

18. The nitride semiconductor light emitting element according to claim 14, wherein the thickness of the first electron blocking layer is 0.9 to 2.0 nm.

19. The nitride semiconductor light emitting element according to claim 15, wherein the thickness of the first electron blocking layer is 0.9 to 2.0 nm.

20. The nitride semiconductor light emitting element according to claim 1, wherein the first electron blocking layer is a non-doped layer that includes effectively no p-type impurities.

21. The nitride semiconductor light emitting element according to claim 2, wherein the first electron blocking layer is a non-doped layer that includes effectively no p-type impurities.

22. The nitride semiconductor light emitting element according to claim 3, wherein the first electron blocking layer is a non-doped layer that includes effectively no p-type impurities.

23. The nitride semiconductor light emitting element according to claim 5, wherein the first electron blocking layer is a non-doped layer that includes effectively no p-type impurities.

24. The nitride semiconductor light emitting element according to claim 7, wherein the first electron blocking layer is a non-doped layer that includes effectively no p-type impurities.

* * * * *